United States Patent [19]
Chaki et al.

[11] Patent Number: 5,469,162
[45] Date of Patent: Nov. 21, 1995

[54] DATA MODULATION METHOD

[75] Inventors: Yasuyuki Chaki, Chiba; Yoshihide Shimpuku, Kanagawa; Hiroyuki Ino, Tokyo, all of Japan

[73] Assignee: Sony Corporation, Tokyo, Japan

[21] Appl. No.: 39,730

[22] Filed: Mar. 30, 1993

[30] Foreign Application Priority Data

Mar. 31, 1992 [JP] Japan ................... 4-105970

[51] Int. Cl.[6] ................................. H03M 7/00
[52] U.S. Cl. ........................... 341/58; 341/95
[58] Field of Search ............... 341/58, 106, 50, 341/95

[56] References Cited

U.S. PATENT DOCUMENTS

| | | | |
|---|---|---|---|
| 4,490,712 | 12/1984 | Gourdon et al. | 341/106 X |
| 4,517,552 | 5/1985 | Shirota et al. | 341/58 |
| 5,192,949 | 3/1993 | Suzuki et al. | 341/58 X |
| 5,196,848 | 3/1993 | Sakazaki | 341/58 |
| 5,198,813 | 3/1993 | Isozaki | 341/58 X |
| 5,304,996 | 4/1994 | Hsu et al. | 341/95 |

*Primary Examiner*—Marc S. Hoff
*Attorney, Agent, or Firm*—Jay H. Maioli

[57] ABSTRACT

In a data modulation method, m-bit data is modulated to n-bit data ($n \geq m$) having fewer direct current and low frequency components. A dispersion of the digital sum variation of code weights can be reduced, a direct current component is reduced and an error rate can be further reduced by selecting a plurality of modulation tables constituting the combination of one or more sub-groups of modulation data obtained by dividing a group of modulation data by a code weight having the same value based on the digital sum variation of the code weights accumulated until a time at which m-bit data is converted to n-bit code and converting next m-bit data continuously to present m-bit data to n-bit code by using the modulation tables.

7 Claims, 7 Drawing Sheets

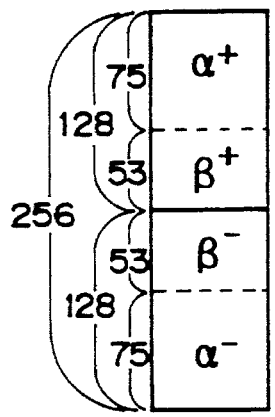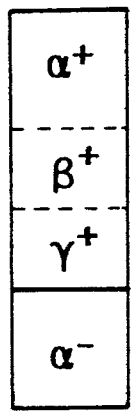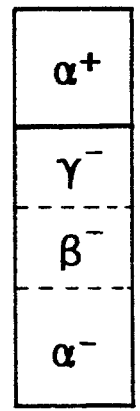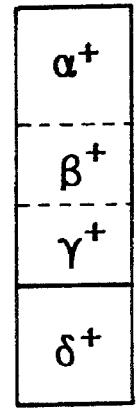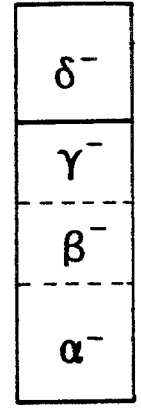
FIG. 2A   FIG. 2B   FIG. 2C   FIG. 2D   FIG. 2E
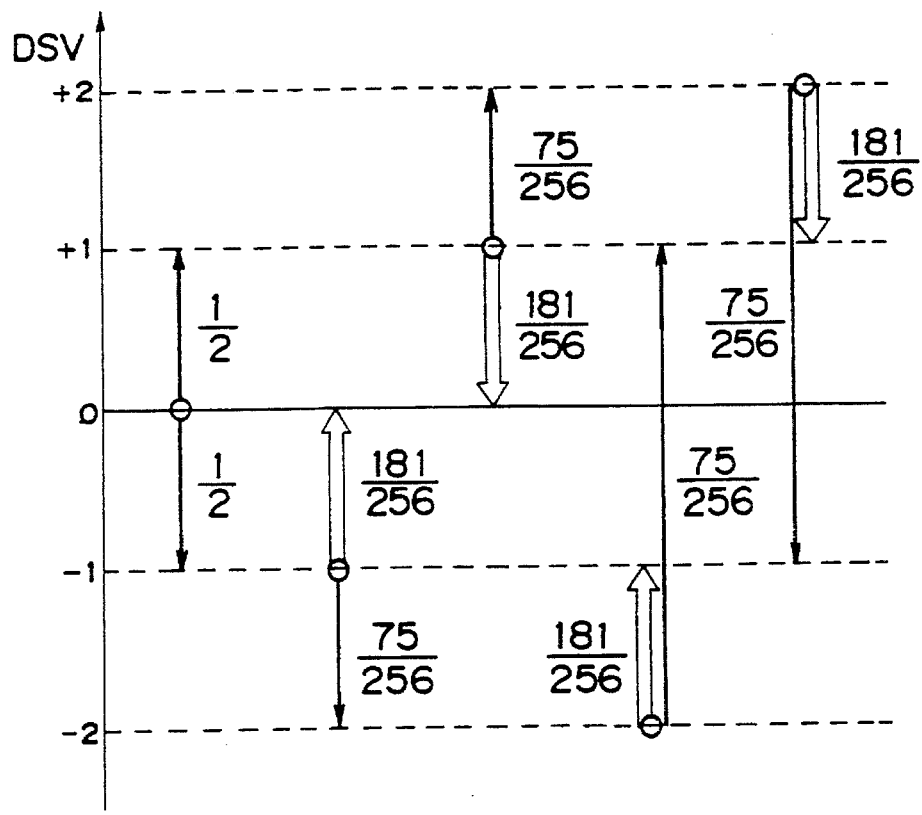
FIG. 3

DATA MODULATION METHOD

FIELD OF THE INVENTION

This invention relates to a data modulation method, and is applicable to a data modulation method for converting, for instance, 8-bit digital data to 11-bit digital data.

BACKGROUND OF THE INVENTION

Conventionally, various data conversion methods are proposed as a code conversion method for recording signals composed of digital data by converting them to codes in conformity with the characteristics of a recording system. These recording codes are required to have a good signal-to-noise ratio (S/N ratio) when reproduced and fewer direct current and low frequency components to improve data restoring capability when data is corrected and data transfer characteristics.

For example, several characteristic recording codes are proposed for digital video tape recorders and an NRZ (non return to zero) code and mirror squared code are widely known as typical recording codes.

When the NRZ code is used independently, an amount of direct current and low frequency components may be reduced, and thus it is contemplated that a probability of appearance of a direct current component is restricted to a given value by using a scrambled coding or an amount of the direct current component is reduced by the addition of a redundant component to the bit string of a conversion code.

The applicants have proposed 8 to 11 conversion (a method of converting 8-bit data to 11-bit code), as an example of the scrambling method, in Japanese Patent Appln. No.036696/1992 (filed on Feb. 24, 1992).

However, even if the scrambling method is applied to 8 to 11 conversion, a direct current component cannot be removed because this is a conversion into an odd number of bits. Further, when the method of adding a redundant component to a bit string is applied to an 8 to 14 conversion (a conversion method of converting 8-bit data to 14-bit code), this method actually corresponds to an 8 to 17 conversion because 3 bits are usually added and thus a problem arises in that a conversion efficiency is lowered.

Thus, a block coding for converting data composed of an NRZ code into a n-bit code having fewer direct current and low frequency components (m≦n) by a m-bit unit is contemplated.

In the case of, for example, an 8 to 10 conversion, this block coding prepares two conversion tables, i.e., a conversion table with a code weight "+2" and a conversion table with a code weight "−2" with single code data and the conversion tables are changed so that a digital sum variation (DSV) of a code system as a whole becomes to "0".

Here, the code weight is a value obtained by determining the digital sum variation of each code data (that is, a digital sum variation for 10 bits) by assuming that a code "1" and code "0" correspond to a value "+1" and value "−1", respectively; and a digital sum variation of a code system as a whole is a digital sum variation of a specific code weight in the code system as a whole. As a result, it can be assumed that when the digital sum variation DSV of the code system has a limited value, a direct current component is not produced.

Incidentally, even in the aforesaid conversion system in which the two conversion tables are prepared and a conversion code is selected from one of the conversion tables in which a digital sum variation DSV is made smaller for each code data, it cannot be said that a direct current component and error rate are sufficiently lowered; therefore, a conversion method capable of further lowering the direct current component and error rate is desired.

In addition, although the use of the 8 to 11 conversion method by which 8-bit digital data is converted to 11-bit code is examined at present as this type of the modulation coding method, this 8 to 11 conversion method creates difficulty in removing a direct current component from the property thereof because it converts an even number of bits to an odd number of bits, and thus the use of suitable conversion tables is desired.

SUMMARY OF THE INVENTION

In view of the foregoing, an object of this invention is to provide a data modulation method by which m-bit data can be converted to n-bit code (n≧m) with fewer direct current and low frequency components.

Another object of the invention is to provide a data modulation method by which a dispersion of the digital sum variation DSV of code weights can be reduced, a direct current component is reduced and an error rate can be further reduced.

The foregoing objects and other objects of the invention have been achieved by the provision of a data modulation method for modulating m-bit data to n-bit modulation code with a less amount of a direct current component in a code system as a whole, wherein n bits are larger than m bits, the data modulation method comprising the following steps gathering modulation codes with a code weight having the same value "±1", "±3" from all the n-bit modulation codes to constitute a group of modulation codes; forming a plurality of modulation tables 2 (21, 22, 23, 24 and 25) by combining one or more subgroups of modulation codes α, β, γ, δ obtained by dividing the group of modulation codes; selecting one of the plurality of the modulation tables 2 (21, 22, 23, 24 and 25) based on the digital sum variation of the code weights accumulated until a time at which the m-bit data is modulated to the n-bit code; and modulating next m-bit data continuously to present m-bit data to n-bit modulation code by using the modulation table 2 (21, 22, 23, 24 and 25).

The nature, principle and utility of the invention will become more apparent from the following detailed description when read in conjunction with the accompanying drawings in which like parts are designated by like reference numerals or characters.

BRIEF DESCRIPTION OF THE DRAWINGS

In the accompanying drawings:

FIGS. 2A to 2E are schematic diagrams showing the arrangement of the modulation tables of the modulation device shown in FIG. 1;

FIG. 3 is a schematic diagram showing the state transition of the digital sum variation of the modulation tables shown in FIGS. 2A to 2E;

DETAILED DESCRIPTION OF THE INVENTION

Figure 1:
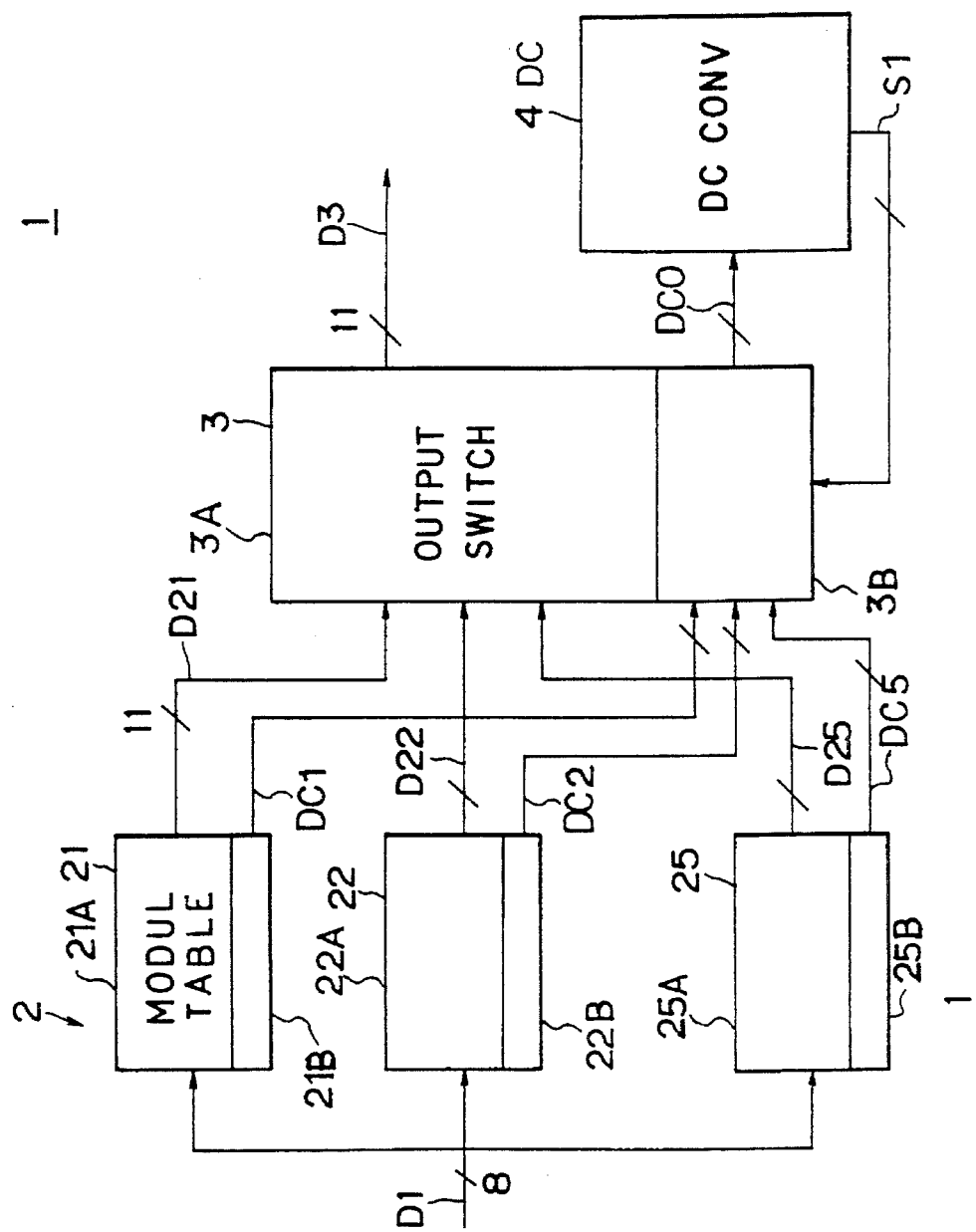
FIG. 1 is a block diagram of an embodiment of a modulation device according to a data modulation method of the present invention.

Preferred embodiments of this invention will be described with reference to the accompanying drawings:

In FIG. 1, 1 designates a modulation device as a whole which sequentially converts 8-bit data D1 input to a modulation table 2 into 11-bit candidate codes D21, D22, D23, D24 and D25.

The modulation table 2 is composed of five modulation tables 21, 22, 23, 24 and 25 and is arranged such that the candidate codes D21, D22, D23, D24 and D25 corresponding to the input data D1 and code weight data DC1, DC2, DC3, DC4 and DC5 of the candidate codes D21, D22, D23, D24 and D25, respectively, are output from channel units 21A, 22A, 23A, 24A and 25A and code weight units 21B, 22B, 23B, 24B and 25B to an output switch circuit 3.

In this embodiment, 256 kinds of modulation codes selected from hundreds of modulation codes with a code weight "±1" or "±3" are stored in each of the modulation tables 21, 22, 23, 24 and 25.

In this embodiment, 128 kinds of modulation codes with a code weight "+1" and 128 kinds of modulation codes with a code weight "−1" are stored in the modulation table 21, wherein a group of 75 modulation codes α+ and a group of 53 modulation codes β+ are stored as the modulation codes with the code weight "+1" and a group of 75 modulation codes α− and a group of 53 modulation codes β− are stored as the modulation codes with the code weight "−1" (FIG. 2A).

Further, 181 kinds of modulation codes with a code weight "+1" and 75 modulation codes with a code weight "−1" are stored in the modulation table 22, wherein a group of 75 modulation codes α+ and a group of 106 modulation codes β+ and γ+ are stored as the modulation codes with the code weight "+1" and a group of 75 modulation codes α− is stored as the modulation codes with the code weight "−1" (FIG. 2B).

On the other hand, modulation codes with a code weight "+1" and modulation codes with a code weight "−1" are stored in the modulation table 23 in a ratio opposite to that of modulation codes stored in the modulation table 22. Further, modulation codes with code weights "+1" and "+3" and modulation codes with code weights "−1" and "−3" are stored in the modulation tables 24 and 25, respectively, in which the ratio of the former codes to the latter codes is the same as the ratio of the modulation data stored in the modulation table 24 to the modulation data stored in the modulation table 25.

More specifically, a group of 75 modulation codes α+ with a code weight "+1" and a group of 181 modulation codes α−, β− and γ− with a code weight "−1" are stored in the modulation table 23 (FIG. 2C), and a group of 181 modulation codes α+, β+ and γ+ with a code weight "+1" and a group of 75 modulation codes δ+ with a code weight "+3" are stored in the modulation table 24 (FIG. 2D).

In the same way, a group of 181 kinds of modulation codes α−, β− and γ− with a code weight "−1" and group of 75 kinds of modulation codes δ− with a code weight "−3" are stored in the modulation table 25 (FIG. 2E).

Incidentally, in this embodiment, the groups of modulation codes α+ and α− correspond to the 75 modulation codes suitably selected from the 181 modulation codes with a code weight "+1" or "−1", and the groups of modulation codes β+, γ+ and β−, γ− each correspond to one-half the remaining 106 modulation codes.

Further, the groups of modulation codes δ+ and δ− correspond to 75 kinds of the modulation codes suitably selected from the modulation codes with a code weight "+3" or "−3", respectively.

Here, the output switch circuit 3 outputs one of the candidate codes D21, D22, D23, D24 and D25 input from the modulation table 2 and selected in response to a selecting signal S1 input from a DC control circuit 4 as output modulation data D3.

Further, the output switch circuit 3 outputs code weight data DC1, DC2, DC3, DC4 and DC5 corresponding to the one of the candidate codes D21, D22, D23, D24 and D25 selected by the selecting signal S1 to the DC control circuit 4 as selected code weight data DC0.

When the selected code weight data DC0 is input to the DC control circuit 4, the DC control circuit 4 adds the selected code weight data DC0 to a previous digital sum variation DSV and determines a present digital sum variation DSVN after the output modulation data D3 has been output to thereby select one of the modulation tables 21, 22, 23, 24 and 25 based on the present digital sum variation DSVN.

When the present digital sum variation DSVN is "0", "+1", "−1", "+2", "−2", the DC control circuit 4 selects modulation table 21 (FIG. 2A), modulation table 23 (FIG. 2C), modulation table 22 (FIG. 2B), modulation table 25 (FIG. 2E), and modulation table 24 (FIG. 2D), respectively.

With this arrangement, when a digital sum variation DSV of the code system as a whole is determined, the modulation device 1 can increase an existence probability having a value near "0" so that values dispersed about "0" can be reduced.

In the above arrangement, when the 8-bit input data D1 is input to the respective modulation tables 21, 22, 23, 24 and 25, the modulation device 1 modulates them to the candidate codes D21, D22, D23, D24 and D25 each having 11 bits and selects a candidate code by which the digital sum variation DSV of the code system as a whole is reduced, through the output switch circuit 3.

At this time, the DC control circuit 4 adds the selected code weight data DC0 of the candidate code which is selected by the selecting signal S1 and output as the output modulation data D3 to the previous digital sum variation DSV0 and determines a present digital sum variation DSVN.

Here, the DC control circuit 4 supplies to the output switch circuit 3 such a selecting signal S1 that selects the one of the codes D21, D22, D23, D24 and D25 candidate code from the one of the modulation tables 2 in which more code weights are stored which increase a probability that the absolute value of a present digital sum variation DSVN at next time is not made larger than the absolute value of the present digital sum variation DSVN.

For example, when the digital sum variation DSV at present has values "+1" and "−1", the modulation tables 23 and 22, in which a larger amount of modulation codes with corresponding code weights of "−1" and "+1" are included, are selected so that a probability that the digital sum variation DSV has a value "0" is increased by the selection of the candidate code D2.

With this arrangement, the digital sum variation DSV at next time has a value "0" with a probability of 181/256 and a value "+2" or "−2" with a probability of 75/256 (FIG. 3).

Further, in the same way, when the digital sum variation DSV at present is "+2" and "−2", the modulation tables 25 and 24, in which a larger amount of candidate code with code weights "−1" and "+1" are included, are selected so that a probability that the digital sum variation DSV has a value near "0" is increased as compared with a present value by the selection of the candidate code D2.

With this arrangement, the digital sum variation DSV at next time has a value "+1" or "−1" with a probability of 181/256 and a value "−1" or "+1" with a probability of 75/256 (FIG. 3).

Figure 4:
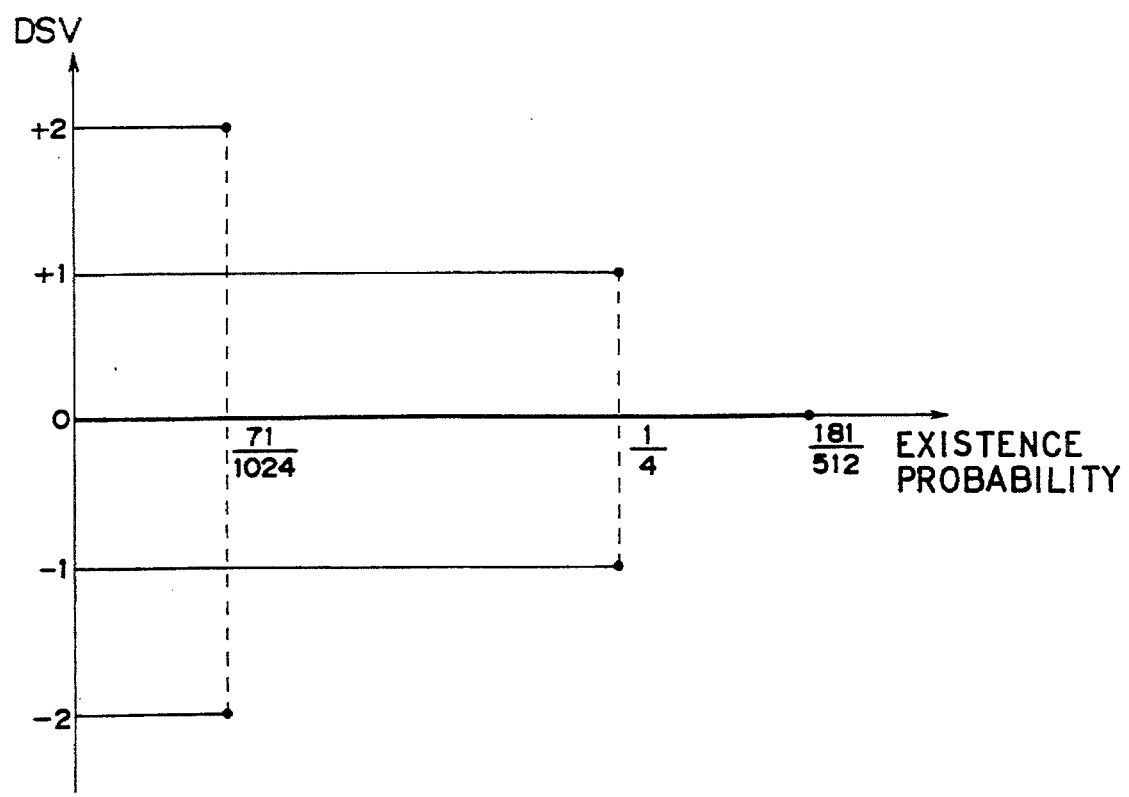
FIG. 4 is a schematic diagram explaining the existence probability of a digital sum variation in a coding system as a whole.

As a result, as shown in FIG. 4, the digital sum variation DSV of the code system as a whole provided by the modulation circuit 1 has a value ranging from "+1" to "−1" with a central value of "0" in almost all cases and a direct current component can be substantially removed.

With this arrangement, the modulation circuit 1 can convert 8-bit data to 11-bit modulation code with a low error rate.

Further, the modulation circuit 1 can effectively avoid the transfer of a modulation code in which a next modulation code has a value changed by the influence of the previous modulation code, whereby the transfer of errors can be reduced.

According to the above arrangement, an 8 to 11 conversion with fewer direct current and low frequency components can be realized in such a manner that a group of modulation codes selected to reduce a dispersion of the digital sum variation DSV in each modulation code unit is stored in the five modulation tables 21, 22, 23, 24 and 25, respectively and the modulation table 2 used for the modulation of the input data is selected based on the value of the digital sum variation DSV.

Note, although the above-mentioned embodiment describes a case in which 8-bit data is converted to 11-bit modulation code by using the five modulation tables, the present invention is not limited thereto and also is applicable to a case in which two modulation tables are used.

Figures 5A, 5B:
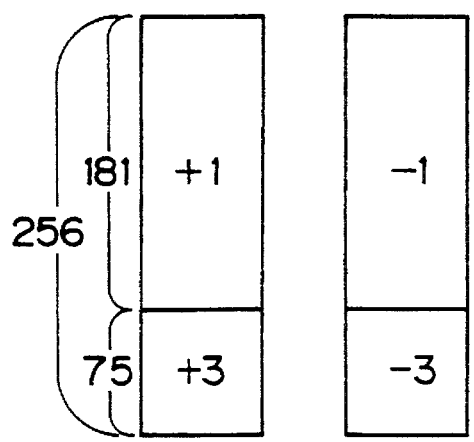
FIGS. 5A and 5B are schematic diagrams showing the arrangement of the modulation tables of a second embodiment.

In this embodiment, as shown in FIGS. 5A and 5B, the two modulation tables select 181 kinds of modulation codes with a code weight "+1" or "−1" from 8 to 11 modulation codes as well as 75 kinds of modulation codes with a code weight "+3" or "−3" therefrom so that the two modulation tables are composed of modulation codes each having a positive value and modulation codes each having a negative values.

Figure 6:
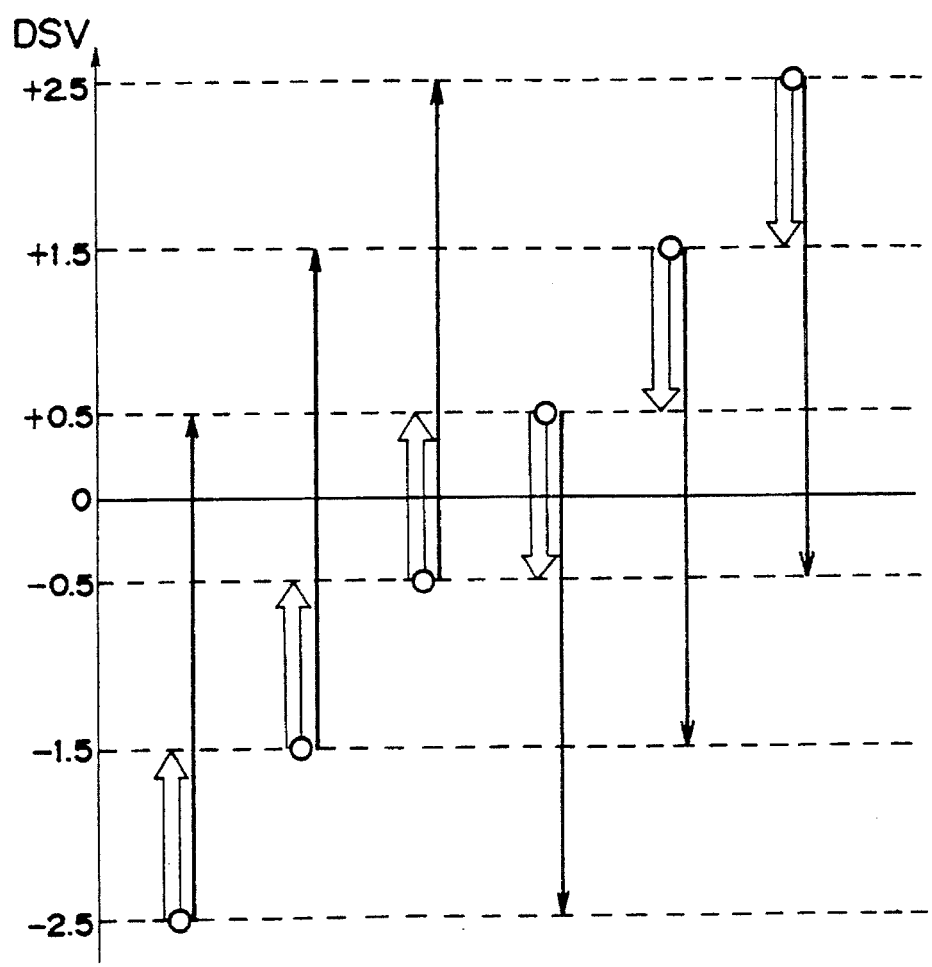
FIG. 6 is a schematic diagram explaining the state transition of the digital sum variation of the modulation table shown in FIGS. 5A and 5B.

As shown in FIG. 6, the digital sum variation DSV of the code system has a value of "±0.5", "±1.5" or "±2.5" at this time, and when the digital sum variation DSV has a positive value, the modulation table composed of the modulation codes each having a negative value is selected, whereas when the digital sum variation DSV has a negative value, the modulation table composed of the modulation codes each having a positive value is selected (FIG. 6).

Figure 7:
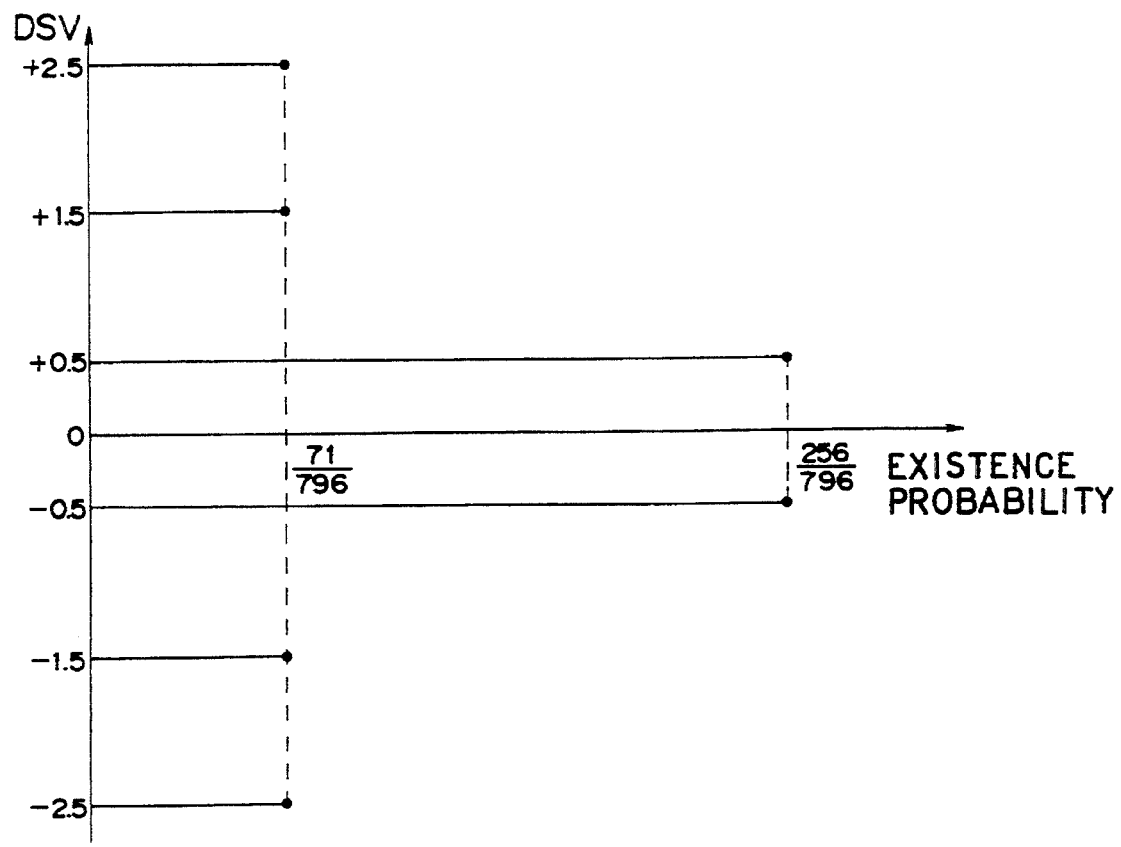
FIG. 7 is a schematic diagram explaining the existence probability of a digital sum variation in a coding system as a whole.
Figures 8A, 8B, 8C, 8D:
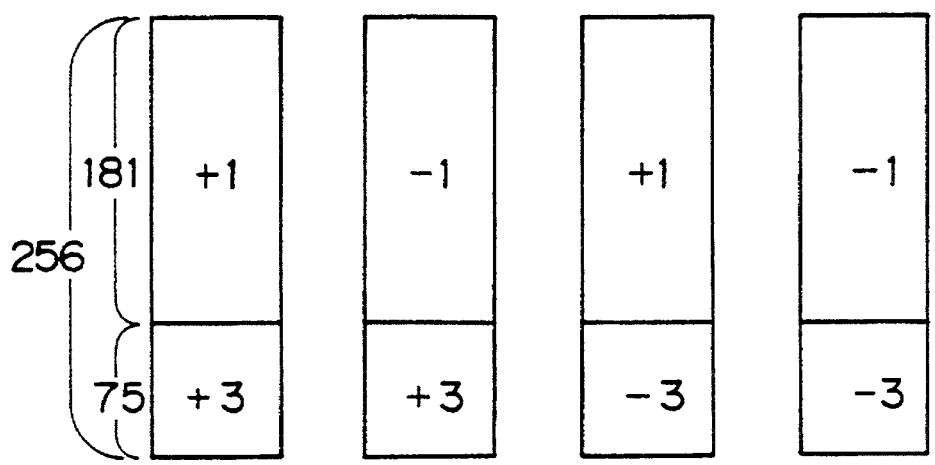
FIGS. 8A to 8D are schematic diagrams showing the arrangement of the modulation tables shown in FIGS. 8A to 8D of another embodiment.

With this arrangement, 8-bit data can be converted to 11-bit modulation code with a low error rate in which the digital sum variation DSV of the code system as a whole has such a value that an existence probability of a value "±0.5" is 2*256/796 in almost all the cases which is far greater than an existence probability of other values, as shown in FIG. 7.

Further, although the above-mentioned first embodiment describes a case in which 8-bit data is converted to 11-bit data by using the five modulation tables, the present invention is not limited thereto and also is applicable to a case in which four modulation tables are used.

In this embodiment, as shown in FIGS. 8A to 8D, the four modulation tables select two sets of 181 kinds of modulation codes with a code weight "+1" or "−1" from the 8 to 11 modulation codes as well as two sets of 75 kinds of modulation codes with a code weight "+3" or "−3" therefrom and are composed by the combination of the respective sets of the modulation codes.

Figure 9:
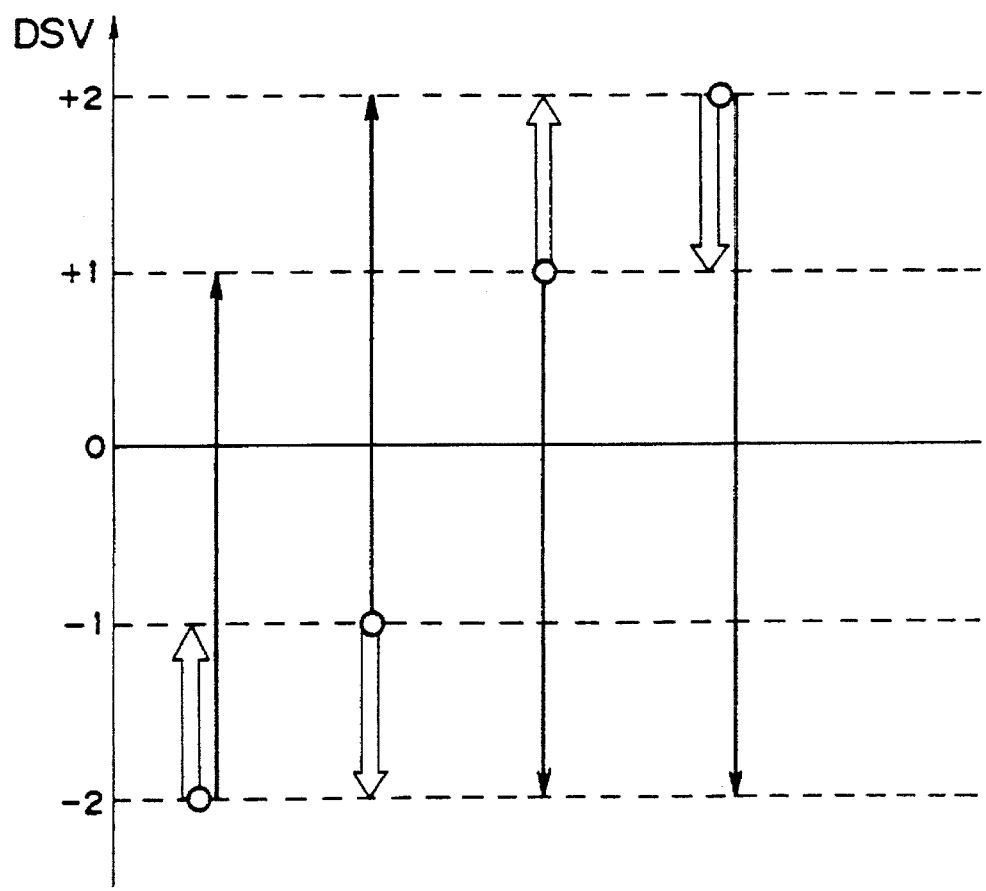
FIG. 9 is a schematic diagram explaining the state transition of the digital sum variation of the modulation tables shown in FIGS. 8A to 8D.

As shown in FIG. 9, the digital sum variation DSV of the modulation system has a value "±1" or "±2" at this time, and when the digital sum variation DSV has a positive value, the modulation table composed of modulation codes each having a higher probability of having a positive value is selected, whereas when the digital sum variation DSV has a negative value, the modulation table composed of modulation codes each having a higher probability of having a negative value is selected.

Figure 10:
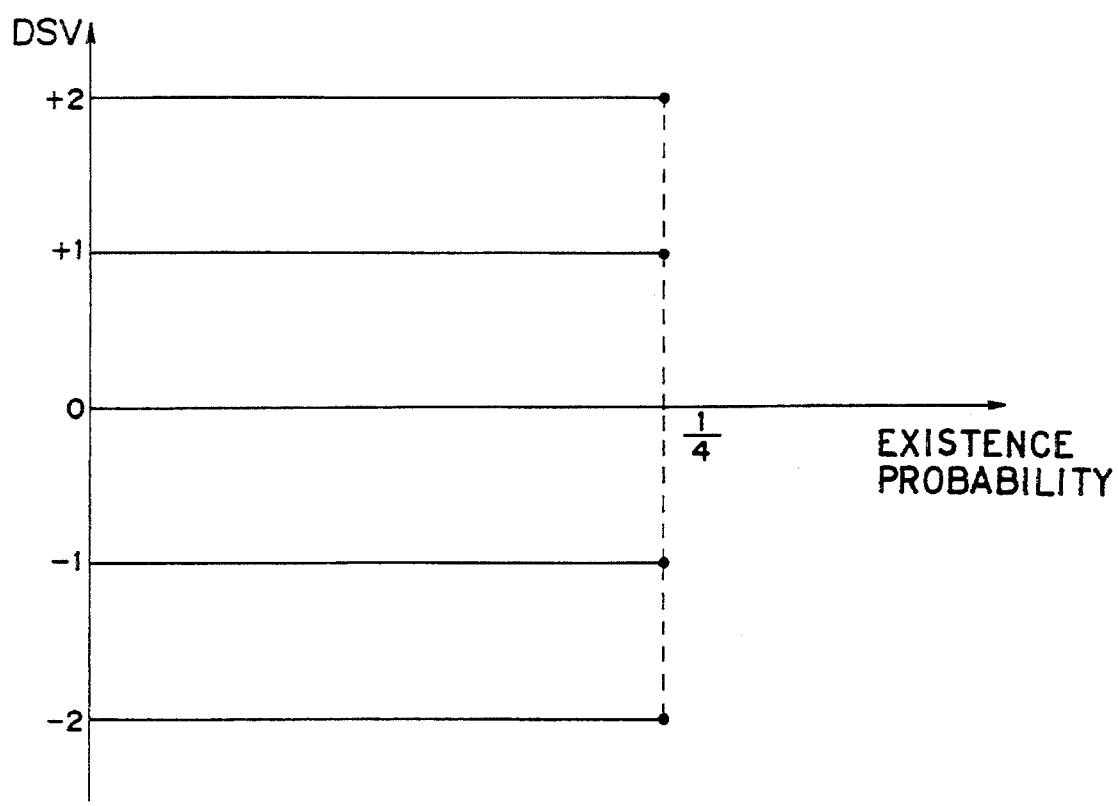
FIG. 10 is a schematic diagram explaining the existence probability of a digital sum variation in a coding system as a whole.

With this arrangement, 8-bit digital data can be converted to 11-bit modulation code with a low error rate in which the digital sum variation DSV of the code system as a whole has such a value that a value "±1" or "±2" can exist with the same probability (¼) as shown in FIG. 10.

Further, although the above-mentioned embodiment describes a case in which 8-bit digital data is converted to 11-bit modulation, the present invention is not limited thereto and in general is widely applicable to a case in which m-bit (m≧1) digital data is converted to n-bit (n≧m) conversion code.

Further, although the above-mentioned embodiment describes a case in which digital data is modulated to modulation data by using two, four or five modulation tables, the present invention is not limited thereto and is widely applicable to a case in which two or more modulation tables are used.

Further, although the above-mentioned embodiment describes a case in which each modulation table is composed of modulation data with two kinds of code weights as shown in FIGS. 2, 5 and 8, the present invention is not limited thereto and the modulation table may be composed of modulation data with three or more kinds of code weights.

While this description is in connection with the preferred embodiments of the invention, it will be obvious to those skilled in the art that various changes and modifications may be aimed, therefore, to cover in the appended claims all such changes and modifications as fall within the true spirit and scope of the invention.

What is claimed is:

1. A data modulation method for modulating m-bit data to a modulation code of n bits with fewer direct current components in a code system as a whole, wherein n bits are larger than m bits, comprising the steps of:

constituting a group of modulation codes by gathering modulation codes with respective code weights having one of a plurality Of predetermined values from all modulation codes composed of n bits, and then forming a plurality of modulation tables storing a respective plurality of subgroups of modulation codes obtained by subdividing said group of modulation codes, each subgroup comprising modulation codes with respective code weights having one of a corresponding combination of two or more of said plurality of predetermined values; and sequentially modulating a plurality of said m-bit data to a respective plurality of said n-bit modulation codes by using said modulation tables, said m-bit data being modulated by converting said m-bit data to a plurality of n-bit candidate modulation codes with respective code weights using said respective plurality of modulation tables, selecting one of said plurality of n-bit candidate modulation codes with respective code weights, based on a digital sum variation of code weights accumulated until a time at which said m-bit data is converted to said plurality of n-bit candidate modulation codes, and then supplying said selected one of said plurality of n-bit candidate modulation codes as said n-bit modulation code, and updating said digital sum variation of code weights using a corresponding code weight of said selected one of said plurality of n-bit candidate modulation codes.

2. A data modulation method for modulating m-bit data to a modulation code of n bits with fewer direct current components in a code system as a whole, wherein n bits are larger than m bits, comprising the steps of:

constituting a group of modulation codes by gathering modulation codes with code weights having a value of one of "+1", "−1", "+3", "−3" from all modulation codes composed of n bits, and then forming a plurality of modulation tables by combining said modulation codes within a group of sub modulation codes obtained by subdividing said group of modulation codes;

selecting one of said plurality of modulation tables, based on digital sum variation of said code weights accumulated until a time at which said m-bit data is modulated to said n-bit code; and modulating next said m-bit data continuously to present said m-bit data to said n-bit modulation code by using said modulation tables.

3. The data modulation method according to claim 2, wherein:

said m is 8 and said n is 11.

4. The data modulation method according to claim 3, wherein said plurality of modulation tables comprises five modulation tables, including:

a first modulation table formed so that a modulation code with a code weight having a value of "+1" or "−1" is selected with a probability of ½, respectively;

a second modulation table formed so that a modulation code with a code weight having a value of "+1" is selected with a probability of 181/256 and a modulation code with a code weight of "−1" is selected with a probability of 75/256;

a third modulation table formed so that a modulation code with a code weight having a value of "+1" is selected with a probability of 75/256, and a modulation code with a code weight having a value of "−1" is selected with a probability of 181/256;

a fourth modulation table formed so that a modulation code with a code weight having a value of "+1" is selected with a probability of 181/256, and a modulation code with a code weight having a value of "+3" is selected with a probability of 75/256; and a fifth modulation table formed so that a modulation code with a code weight having a value of "−3" is selected with a probability of 75/256, and a modulation code with a code weight having a value of "−1" is selected with a probability of 181/256.

5. The data modulation method according to claim 3, wherein said plurality of modulation tables comprises two modulation tables, including:

a first modulation table formed so that a modulation code with a code weight having a value of "+1" is selected with a probability of 181/256, and a modulation code with a code weight having a value of "+3" is selected with a probability of 75/256; and a second modulation table formed so that a modulation code with a code weight having a value of "−3" is selected with a probability of 75/256, and a modulation code with a code weight having a value of "−1" is selected with a probability of 181/256.

6. The data modulation method according to claim 3, wherein said plurality of modulation tables comprises four modulation tables, including:

a first modulation table formed so that a modulation code with a code weight having a value of "+1" is selected with a probability of 181/256, and a modulation code with a code weight having a value of "+3" is selected with a probability of 75/256;

a second modulation table formed so that a modulation code with a code weight having a value of "−1" is selected with a probability of 181/256, and a modulation code with a code weight having a value of "+3" is selected with a probability of 75/256;

a third modulation table formed so that a modulation code with a code weight having a value of "+1" is selected with a probability of 181/256, and a modulation code with a code weight having a value of "−3" is selected with a probability of 75/256; and a fourth modulation table formed so that a modulation code with a code weight having a value of "−1" is selected with a probability of 181/256, and a modulation code with a code weight having a value of "−3" is selected with a probability of 75/256.

7. A data modulation method for modulating 8-bit data to 11-bit modulation code with less direct current component in a code system as a whole, comprising the steps of:

constituting a group of modulation codes by gathering modulation codes with respective code weights having one of a plurality of predetermined values from all modulation codes composed of 11 bits, and then forming five modulation tables storing respective subgroups of modulation codes obtained by subdividing said group of modulation codes, each subgroup comprising modulation codes with respective code weights having one of a corresponding combination of two or more of said plurality of predetermined values; and sequentially modulating a plurality of said 8-bit data to a respective plurality of said 11-bit modulation code by using said modulation tables, said 8-bit data being modulated by converting said 8-bit data to five 11-bit candidate modulation codes with five respective code weights using said five respective modulation tables, selecting one of said five 11-bit candidate modulation codes with said five respective code weights, based on a digital sum variation of code weights accumulated until a time at which said 8-bit data is modulated to said five 11-bit candidate modulation codes, and then supplying said selected one of said five 11-bit candidate modulation codes as said 11-bit modulation code, and updating said digital sum variation of code weights using a corresponding code weight of said selected one of said five 11-bit candidate modulation codes.

* * * * *

UNITED STATES PATENT AND TRADEMARK OFFICE
CERTIFICATE OF CORRECTION

PATENT NO. : 5,469,162
DATED : November 21, 1995
INVENTOR(S) : Yasuyuki Chaki, Yoshihide Shimpuku, and Hiroyuki Ino It is certified that error appears in the above-identified patent and that said Letters Patent is hereby corrected as shown below:

Col. 1, line 53, delete "to"
Col. 2, line 31, after "steps" insert --:--
Col. 3, line 5, change "table" to --tables--
Col. 4, line 30, after "outputs" insert --one of--
Col. 5, line 2, change "candidate code" to--(candidate code D2)--
Col. 6, line 41, after "modulation" insert --code--

Col. 7, line 4, change "Of" to --of--

Signed and Sealed this

Thirteenth Day of August, 1996

Attest:

BRUCE LEHMAN

Attesting Officer      Commissioner of Patents and Trademarks